United States Patent
Wu et al.

(10) Patent No.: US 9,773,877 B2
(45) Date of Patent: Sep. 26, 2017

(54) WIDE BANDGAP FIELD EFFECT TRANSISTORS WITH SOURCE CONNECTED FIELD PLATES

(75) Inventors: Yifeng Wu, Goleta, CA (US); Primit Parikh, Goleta, CA (US); Umesh Mishra, Montecito, CA (US); Marcia Moore, Santa Barbara, CA (US)

(73) Assignee: CREE, INC., Goleta, CA (US)

( * ) Notice: Subject to any disclaimer, the term of this patent is extended or adjusted under 35 U.S.C. 154(b) by 0 days.

(21) Appl. No.: 10/958,945

(22) Filed: Oct. 4, 2004

(65) Prior Publication Data
US 2005/0253167 A1 Nov. 17, 2005

Related U.S. Application Data

(60) Provisional application No. 60/571,342, filed on May 13, 2004.

(51) Int. Cl.
| | |
|---|---|
| H01L 31/0328 | (2006.01) |
| H01L 29/40 | (2006.01) |
| H01L 29/417 | (2006.01) |
| H01L 29/812 | (2006.01) |
| H01L 29/20 | (2006.01) |

(52) U.S. Cl.
CPC ...... *H01L 29/402* (2013.01); *H01L 29/41725* (2013.01); *H01L 29/812* (2013.01); *H01L 29/2003* (2013.01)

(58) Field of Classification Search
CPC .............. H01L 29/2003; H01L 29/402; H01L 29/41725; H01L 29/812
USPC ................ 257/280, 281, 282, 488, 496, 508
See application file for complete search history.

(56) References Cited

U.S. PATENT DOCUMENTS

| | | | |
|---|---|---|---|
| 4,290,077 A | * | 9/1981 | Ronen ........................... 257/409 |
| 4,551,905 A | | 11/1985 | Chao et al. .................... 438/570 |
| 4,766,474 A | | 8/1988 | Nakagawa et al. |
| 4,876,213 A | * | 10/1989 | Pfiester .......................... 438/231 |
| 4,947,232 A | | 8/1990 | Ashida et al. .................. 357/53 |

(Continued)

FOREIGN PATENT DOCUMENTS

| | | |
|---|---|---|
| CN | 1242608 A | 1/2000 |
| CN | 1321340 | 11/2001 |

(Continued)

OTHER PUBLICATIONS

Wataru Saito (IEEE Transactions on Electron Devices, vol. 50, No. 12, Dec. 2003).*

(Continued)

*Primary Examiner* — Ori Nadav
(74) *Attorney, Agent, or Firm* — Koppel, Patrick, Heybl & Philpott

(57) ABSTRACT

A field effect transistor comprising a buffer and channel layer formed successively on a substrate. A source electrode, drain electrode, and gate are all formed in electrical contact with the channel layer, with the gate between the source and drain electrodes. A spacer layer is formed on at least a portion of a surface of the channel layer between the gate and drain electrode and a field plate is formed on the spacer layer isolated from the gate and channel layer. The spacer layer is electrically connected by at least one conductive path to the source electrode, wherein the field plate reduces the peak operating electric field in the MESFET.

35 Claims, 2 Drawing Sheets

(56) References Cited

U.S. PATENT DOCUMENTS

| | | | |
|---|---|---|---|
| 5,053,348 A | 10/1991 | Mishra et al. ............... 438/571 |
| 5,187,552 A | 2/1993 | Hendrickson et al. |
| 5,192,987 A | 3/1993 | Khan et al. ............... 257/183.1 |
| 5,196,359 A | 3/1993 | Shih et al. ............... 437/40 |
| 5,290,393 A | 3/1994 | Nakamura ............... 257/488 |
| 5,399,886 A | 3/1995 | Hasegawa ............... 257/192 |
| 5,470,767 A | 11/1995 | Nakamoto et al. ............... 438/570 |
| 5,543,253 A | 8/1996 | Park ............... 216/12 |
| 5,569,937 A | 10/1996 | Bhatnagar ............... 257/77 |
| 5,643,811 A * | 7/1997 | Hasegawa ......... H01L 21/28587 257/E21.407 |
| 5,652,179 A | 7/1997 | Strifler et al. ............... 438/578 |
| 5,701,019 A | 12/1997 | Matsumoto et al. ............... 257/192 |
| 5,710,455 A | 1/1998 | Bhatnagar et al. ............... 257/472 |
| 5,780,900 A | 7/1998 | Suzuki et al. ............... 257/335 |
| 5,876,901 A | 3/1999 | Ishimaru ............... 257/28 |
| 5,885,860 A | 3/1999 | Weitzel et al. ............... 257/347 |
| 5,929,467 A | 7/1999 | Kawai et al. ............... 257/192 |
| 5,956,590 A * | 9/1999 | Hsieh et al. ............... 438/303 |
| 5,959,307 A | 9/1999 | Nakamura et al. ............... 257/14 |
| 6,033,948 A | 3/2000 | Kwon et al. |
| 6,057,564 A | 5/2000 | Rennie ............... 257/99 |
| 6,100,549 A * | 8/2000 | Weitzel et al. ............... 257/194 |
| 6,100,571 A | 8/2000 | Mizuta et al. ............... 27/95 |
| 6,127,703 A | 10/2000 | Letavic et al. ............... 257/347 |
| 6,139,995 A | 10/2000 | Burm ............... 257/27 |
| 6,140,169 A | 10/2000 | Kawai et al. ............... 438/197 |
| 6,242,766 B1 | 6/2001 | Tateno ............... 257/194 |
| 6,294,801 B1 | 9/2001 | Inokuchi et al. ............... 257/192 |
| 6,307,232 B1 | 10/2001 | Akiyama et al. ............... 257/347 |
| 6,346,451 B1 | 2/2002 | Simpson et al. ............... 21/331 |
| 6,355,951 B1 | 3/2002 | Hattori ............... 257/280 |
| 6,445,038 B1 | 9/2002 | Tihanyi |
| 6,475,857 B1 | 11/2002 | Kim et al. ............... 438/240 |
| 6,483,135 B1 | 11/2002 | Mizuta et al. |
| 6,495,409 B1 | 12/2002 | Manfra et al. ............... 438/216 |
| 6,548,333 B2 | 4/2003 | Smith ............... 257/194 |
| 6,559,513 B1 | 5/2003 | Miller et al. ............... 257/488 |
| 6,586,813 B2 * | 7/2003 | Nagahara ............... 257/472 |
| 6,620,688 B2 | 9/2003 | Woo et al. ............... 438/262 |
| 6,621,121 B2 | 9/2003 | Baliga ............... 257/330 |
| 6,624,488 B1 | 9/2003 | Kim ............... 29/76 |
| 6,627,473 B1 | 9/2003 | Oikawa et al. ............... 438/46 |
| 6,686,616 B1 * | 2/2004 | Allen et al. ............... 257/280 |
| 6,690,042 B2 | 2/2004 | Khan et al. ............... 257/192 |
| 6,707,102 B2 * | 3/2004 | Morikawa ............ H01L 29/402 257/328 |
| 6,740,535 B2 | 5/2004 | Singh et al. ............... 438/18 |
| 6,787,817 B2 * | 9/2004 | Takazawa et al. ............... 257/183 |
| 6,838,325 B2 | 1/2005 | Whelan et al. ............... 438/172 |
| 6,870,219 B2 | 3/2005 | Brech |
| 6,891,235 B1 | 5/2005 | Furukawa et al. ............... 257/480 |
| 6,902,964 B2 | 6/2005 | Sriram |
| 6,903,383 B2 | 6/2005 | Yohogawa ............... 257/192 |
| 6,933,544 B2 * | 8/2005 | Saito et al. ............... 257/194 |
| 6,940,090 B2 * | 9/2005 | Saito et al. ............... 257/20 |
| 6,972,440 B2 | 12/2005 | Singh et al. ............... 257/194 |
| 7,012,286 B2 | 3/2006 | Inai et al. ............... 257/192 |
| 7,038,252 B2 * | 5/2006 | Saito et al. ............... 257/192 |
| 7,041,541 B2 * | 5/2006 | Behammer ............... 438/182 |
| 7,071,498 B2 | 7/2006 | Johnson ............... 257/109 |
| 7,075,125 B2 * | 7/2006 | Saito et al. ............... 257/194 |
| 7,126,426 B2 * | 10/2006 | Mishra et al. ............... 330/307 |
| 7,229,903 B2 | 6/2007 | Li et al. ............... 438/571 |
| 7,282,423 B2 | 10/2007 | Furukawa et al. ............... 438/422 |
| 7,465,967 B2 | 12/2008 | Smith et al. ............... 257/194 |
| 7,501,669 B2 | 3/2009 | Parikh et al. ............... 257/194 |
| 7,508,015 B2 | 3/2009 | Saito et al. ............... 257/192 |
| 7,550,783 B2 | 6/2009 | Wu et al. ............... 257/192 |
| 7,679,111 B2 | 3/2010 | Cao et al. ............... 257/287 |
| 7,800,131 B2 | 9/2010 | Miyamoto et al. ............... 257/192 |
| 7,812,369 B2 | 10/2010 | Chini et al. ............... 257/192 |
| 7,863,648 B2 | 1/2011 | Miyamoto et al. ............... 257/192 |
| 7,964,915 B2 | 6/2011 | Tanaka et al. ............... 257/341 |
| 8,120,066 B2 | 2/2012 | Lanzieri et al. ............... 257/194 |
| 8,193,562 B2 | 6/2012 | Suh et al. ............... 257/194 |
| 8,502,323 B2 | 8/2013 | Chen ............... 257/392 |
| 8,823,057 B2 | 9/2014 | Sheppard et al. ............... 257/192 |
| 8,901,604 B2 | 12/2014 | Mishra et al. ............... 257/170 |
| 2001/0015442 A1 | 8/2001 | Kondoh et al. ............... 257/79 |
| 2001/0015446 A1 | 8/2001 | Inoue et al. |
| 2001/0023964 A1 * | 9/2001 | Wu et al. ............... 257/368 |
| 2002/0005528 A1 | 1/2002 | Nagahara |
| 2002/0017648 A1 | 2/2002 | Kasahara |
| 2002/0033508 A1 * | 3/2002 | Morikawa ............ H01L 29/402 257/368 |
| 2002/0105028 A1 | 8/2002 | Fujihira ............... 257/339 |
| 2002/0137236 A1 | 9/2002 | Schaff et al. |
| 2002/0137318 A1 | 9/2002 | Peake et al. |
| 2002/0139995 A1 | 10/2002 | Inoue et al. ............... 257/194 |
| 2002/0145172 A1 | 10/2002 | Fujishima et al. |
| 2002/0155646 A1 | 10/2002 | Petruzzello et al. |
| 2003/0006437 A1 | 1/2003 | Mizuta et al. |
| 2003/0075719 A1 | 4/2003 | Sriram |
| 2003/0107081 A1 | 6/2003 | Lee et al. |
| 2003/0132463 A1 | 7/2003 | Miyoshi ............... 257/280 |
| 2003/0141518 A1 | 7/2003 | Yokogawa ............... 257/194 |
| 2003/0183844 A1 | 10/2003 | Yokoyama et al. |
| 2003/0183886 A1 | 10/2003 | Inoue |
| 2003/0222327 A1 | 12/2003 | Yamaguchi et al. |
| 2004/0021152 A1 | 2/2004 | Nguyen et al. ............... 257/192 |
| 2004/0021175 A1 | 2/2004 | Brech |
| 2004/0029330 A1 | 2/2004 | Hussain et al. ............... 438/172 |
| 2004/0124435 A1 | 7/2004 | D'Evelyn et al. ............... 257/103 |
| 2004/0188775 A1 | 9/2004 | Peake et al. |
| 2004/0201038 A1 | 10/2004 | Kimura et al. |
| 2004/0227211 A1 | 11/2004 | Saito et al. |
| 2005/0051796 A1 | 3/2005 | Parikh |
| 2005/0051800 A1 | 3/2005 | Mishra ............... 257/202 |
| 2005/0062069 A1 * | 3/2005 | Saito et al. ............... 257/213 |
| 2005/0082611 A1 | 4/2005 | Peake et al. |
| 2005/0110042 A1 | 5/2005 | Saito et al. |
| 2005/0124100 A1 | 6/2005 | Robinson ............... 438/167 |
| 2005/0133818 A1 | 6/2005 | Johnson et al. ............... 257/192 |
| 2005/0208722 A1 | 9/2005 | Peake et al. ............... 438/259 |
| 2005/0253167 A1 | 11/2005 | Wu et al. |
| 2005/0253168 A1 * | 11/2005 | Wu et al. ............... 257/192 |
| 2006/0006415 A1 * | 1/2006 | Wu et al. ............... 257/194 |
| 2006/0011915 A1 | 1/2006 | Saito et al. |
| 2006/0043416 A1 | 3/2006 | Li et al. ............... 257/192 |
| 2006/0071247 A1 | 4/2006 | Chen et al. |
| 2006/0081877 A1 | 4/2006 | Kohji et al. ............... 257/194 |
| 2006/0108606 A1 | 5/2006 | Saxler ............... 257/200 |
| 2006/0118809 A1 | 6/2006 | Parikh et al. ............... 257/103 |
| 2006/0202272 A1 | 9/2006 | Wu |
| 2006/0220272 A1 | 10/2006 | Smith ............... 257/355 |
| 2006/0286732 A1 | 12/2006 | Burke et al. ............... 438/197 |
| 2007/0059873 A1 | 3/2007 | Chini et al. ............... 438/199 |
| 2007/0102727 A1 | 5/2007 | Twynam ............... 257/194 |
| 2007/0164315 A1 | 7/2007 | Smith ............... 257/194 |
| 2007/0194354 A1 | 8/2007 | Wu ............... 257/288 |
| 2007/0235755 A1 | 10/2007 | Takei ............... 257/288 |
| 2007/0235775 A1 | 10/2007 | Wu |
| 2007/0241368 A1 | 10/2007 | Mil'shtein ............... 257/192 |
| 2007/0249119 A1 | 10/2007 | Saito ............... 438/253 |
| 2008/0006898 A1 | 1/2008 | Yafune et al. ............... 257/471 |
| 2008/0067558 A1 | 3/2008 | Kawasaki |
| 2008/0116492 A1 | 5/2008 | Wu |
| 2008/0128752 A1 | 6/2008 | Wu |
| 2008/0230786 A1 | 9/2008 | Heikman |
| 2009/0032820 A1 | 2/2009 | Chen ............... 257/76 |
| 2009/0230429 A1 | 9/2009 | Miyamoto et al. ............... 257/192 |
| 2009/0230430 A1 | 9/2009 | Miyamoto et al. ............... 257/192 |
| 2009/0236635 A1 | 9/2009 | Wu et al. ............... 257/194 |
| 2010/0025730 A1 | 2/2010 | Heikman |
| 2010/0155780 A1 | 6/2010 | Machida |
| 2010/0201439 A1 | 8/2010 | Wu et al. ............... 327/581 |
| 2010/0314666 A1 | 12/2010 | Saito et al. |
| 2011/0241020 A1 | 10/2011 | Saunier ............... 257/77 |
| 2011/0260217 A1 | 10/2011 | Okamoto |
| 2012/0068722 A1 | 3/2012 | Khandelwal |
| 2012/0068772 A1 | 3/2012 | Murad |
| 2012/0104408 A1 | 5/2012 | Imada ............... 257/76 |
| 2012/0132959 A1 | 5/2012 | Parikh et al. ............... 257/194 |

(56) References Cited

U.S. PATENT DOCUMENTS

| | | | |
|---|---|---|---|
| 2012/0175679 A1 | 7/2012 | Marino et al. | 257/194 |
| 2012/0218783 A1 | 8/2012 | Imada | 363/37 |
| 2012/0235156 A1 | 9/2012 | Kuraguchi | 257/76 |
| 2012/0261720 A1 | 10/2012 | Puglisi et al. | 257/76 |
| 2013/0062667 A1 | 3/2013 | Chini et al. | 257/195 |
| 2013/0069115 A1 | 3/2013 | Nakazawa | |
| 2013/0069117 A1 | 3/2013 | Yoshioka | |
| 2013/0083567 A1 | 4/2013 | Imada | 363/37 |
| 2013/0175544 A1 | 7/2013 | Oishi | |
| 2013/0193485 A1 | 8/2013 | Akiyama et al. | 257/194 |
| 2013/0292699 A1 | 11/2013 | Ueno | 257/76 |
| 2014/0001478 A1 | 1/2014 | Saunier et al. | 257/76 |
| 2014/0061659 A1 | 3/2014 | Teplik et al. | 257/76 |
| 2014/0175453 A1 | 6/2014 | Yamada | 257/76 |
| 2014/0239346 A1 | 8/2014 | Green | 257/192 |
| 2014/0264360 A1 | 9/2014 | Huang et al. | 257/76 |
| 2014/0353720 A1 | 12/2014 | Inoue | 257/192 |
| 2014/0361341 A1 | 12/2014 | Sriram et al. | 257/194 |
| 2014/0361343 A1 | 12/2014 | Sriram | 257/194 |

FOREIGN PATENT DOCUMENTS

| | | | |
|---|---|---|---|
| CN | 1321340 A | 11/2001 | |
| CN | 1242608 | 1/2003 | |
| CN | 1428870 A | 7/2003 | |
| CN | 1639875 A | 7/2005 | |
| EP | 0069429 A | 1/1983 | |
| EP | 0792028 A2 | 6/1997 | |
| EP | 0792028 | 8/1997 | |
| EP | 1 336 989 A2 | 8/2003 | |
| EP | 1336989 | 8/2003 | |
| EP | 1336989 A2 | 8/2003 | |
| JP | 62-237763 | 10/1987 | |
| JP | 63-087773 | 4/1988 | |
| JP | 305536 A | 2/1991 | |
| JP | 03035536 | 2/1991 | |
| JP | 05021793 A | 1/1993 | |
| JP | 06-349859 | 12/1994 | |
| JP | 06349859 | 12/1994 | |
| JP | 6349859 | 12/1994 | 21/338 |
| JP | 6349859 A | 12/1994 | |
| JP | 07038108 | 2/1995 | |
| JP | 07050413 | 2/1995 | |
| JP | 07176544 | 7/1995 | |
| JP | 09232827 | 9/1997 | |
| JP | H09232827 | 9/1997 | |
| JP | 11008256 | 1/1999 | |
| JP | H118256 | 1/1999 | |
| JP | 1197455 | 4/1999 | |
| JP | 11233525 | 8/1999 | |
| JP | 11-274174 | 10/1999 | |
| JP | 11274174 | 10/1999 | |
| JP | 11274174 A | 10/1999 | |
| JP | 2000-003919 | 1/2000 | |
| JP | 2000003919 | 1/2000 | |
| JP | 2000082671 | 3/2000 | |
| JP | 2000-100831 | 4/2000 | |
| JP | 2000100831 A | 4/2000 | |
| JP | 2000-164926 | 6/2000 | |
| JP | 2000174260 | 6/2000 | |
| JP | 2000003919 A | 7/2000 | |
| JP | 2002-270830 | 3/2001 | |
| JP | 2001094091 | 4/2001 | |
| JP | 2001160656 | 6/2001 | |
| JP | 2001189324 | 7/2001 | |
| JP | 2002-016245 | 1/2002 | |
| JP | 2002016245 | 1/2002 | |
| JP | 2002094054 | 3/2002 | |
| JP | 2002100642 | 4/2002 | |
| JP | 2002118122 | 4/2002 | |
| JP | 2000270620 | 9/2002 | |
| JP | 2002270830 A | 9/2002 | |
| JP | 2002343814 | 11/2002 | |
| JP | 2002094054 A | 3/2003 | |
| JP | 2003100775 | 4/2003 | |
| JP | 2003188189 | 7/2003 | |
| JP | 2003203923 | 7/2003 | |
| JP | 2003203923 A | 7/2003 | |
| JP | 297854 | 10/2003 | |
| JP | 2003297854 | 10/2003 | |
| JP | 2003297854 A | 10/2003 | |
| JP | 2005507174 | 3/2005 | |
| JP | 2005093864 | 4/2005 | |
| JP | 2005527102 A | 9/2005 | |
| JP | 2005535113 | 11/2005 | |
| JP | 2005340417 | 12/2005 | |
| JP | 2007019560 | 1/2007 | |
| JP | 2010278333 | 12/2010 | |
| KR | 2000000628 | 1/2003 | |
| TW | 334632 B | 6/1998 | |
| TW | 552712 B | 9/2003 | |
| TW | 579600 B | 3/2004 | |
| TW | I2230978 B | 4/2005 | |
| WO | WO 9908323 | 2/1999 | |
| WO | WO 02093650 | 11/2002 | |
| WO | WO 03/032397 A2 | 4/2003 | |
| WO | WO 03036729 | 5/2003 | |
| WO | WO 03036729 A1 | 5/2003 | |
| WO | WO 03038905 A2 | 5/2003 | |
| WO | WO 2004068590 | 8/2004 | |
| WO | WO 2004068590 A1 | 8/2004 | |
| WO | WO 2006025971 | 7/2005 | |
| WO | WO 2005114743 | 12/2005 | |
| WO | WO 2006025971 | 3/2006 | |

OTHER PUBLICATIONS

Huili Xing (IEEE Electron Device Letters, vol. 25, No. 4, Apr. 2004).*

Saito et al. "High Breakdown Voltage AlGaN—GaN Power-HEMT Design and High Current Density Switching Behavior." IEEE Transactions on Elecron Devices. vol. 50, No. 12, Dec. 2003. pp. 2528-2531.*

Asano K et al: "Novel High Power AlGaAs/GaAs HPET With a Field-Modulating Plate Operated at 35 V Drain Voltage", Electron Devices Meeting, 1998. IDM '98 Technical Digest. International San Francisco, CA USA Dec. 6-9, 1998, Piscataway, NJ, USA IEEE US, Dec. 6, 1998, pp. 59-62 XP010331500.

Wakajima A et al, "High Power Density and Low Distortion InGaP Channel FETs With Field-Modulating Plate", IEICE Transactions on Electronics, Institute of Electronics Information and Comm. Eng. Tokyo, JP, vol. 885-C, No. 12, Dec. 2002, pp. 2041-2045, XP001161324.

Moe P K T et al, "A Novel High-Voltage High-Speed MESFET Using a Standard GaAs Digital IC Process" IEEE Transactions on Electron Devices, IEEE Inc. New York, US. vol. 41, No. 3, Feb. 1, 1994, pp. 346-350, XP000478051.

Xing H. et al. "High Breakdown Voltage AlGaN-GaN HEMTs Achieved by Multiple Field Plates" IEEE Electron Devices Letters, IEEE Inc. New York, US. vol. 25, No. 4, Apr. 2004, pp. 161-163, XP001190361.

Patent Abstracts of Japan, vol. 017, No. 295, Jun. 7, 1993.

Saito W et al., Design and Demonstration of High Breakdown Voltage GaN High Electron Mobility Transistor (HEMT) Using Field Plate Structure for Power Electronics Applications, Japanese Journal of Applied Physics, vol. 43, No. 4B, Apr. 2004, pp. 2239-2242, XP001227744.

Saito W. et al. "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP vol. 43, , No. 4B, Apr. 2004 pp. 2239-2242, XP001227744, ISSN: 0021-4922.

Saito et al., Solid-State Electronics, Theoretical Limit Estimation of Lateral Wide Bandgap Semiconductor Power-Switching Device, Apr. 1, 2003, pp. 1555-1562.

Japanese Journal of Applied Physics, vol. 43, No. 4B, 2004, pp. 2239-2242, XP-001227744, Design and Demonstration of High

(56) References Cited

OTHER PUBLICATIONS

Breakdown Voltage GaN High Electron Mobility Transistor (HEMT) Using Field Plate Structure for Power Electronics Applications, Saito et al.
Second Office Action from related China Application No. 200580015278.5, Dated: Dec. 19, 2008.
Saito, "Design and Demonstration of High Breakdown voltage GaN High Electron Mobility Transistor HEMT Using Field Plate Structure for Power electronics Applications" Japanese Journal of Applied Physics vol. 43, No. 4B, 2004, pp. 2230-2242.
Communication Pursuant to Article 94(3) EPC re: related European Application No. 07018026.0.
Patent Abstracts of Japan, Pub. No. 07176544, Pub. Date: Jul. 14, 1995.
Official Notice of Final Decision of Rejection re Japan Patent App. No. 2006-526270, Dated: Jan. 23, 2009.
Third Office Action from related Chinese Application No. 200580014866.7, dated:Oct. 30, 2009.
From related application: Chinese Patent Application No. 200580014868.6, Second Office Action dated Feb. 24, 2010.
Office Action from European Patent Application No. 05735109.0 dated Aug. 27, 2010.
Notification of Rejection/Objection in Chinese Patent Application No. 200580014868.6 dated Aug. 11, 2010.
Extended Search Report for European Patent Application No. 10183441.4 dated Dec. 2, 2010.
Extended Search Report for European Patent Application No. 10183607.0 dated Dec. 6, 2010.
Saito, W., et al., "Theoretical Limit Estimation of Lateral Wide Band-Gap Semiconductor Power-Switching Device", Solid State Electronics, Elsevier Science Publishers, Barking, GB, vol. 48, No. 9, Apr. 23, 2004, pp. 1555-1562.
Office Action from counterpart European Patent Application No. 05756258.9 dated Jun. 10, 2010.
Notice Requesting Submission of Opinion in Korean Patent Application No. 10-2006-7004682 dated Feb. 17, 2011.
Interrogation from Japanese Patent Application No. 2007-513132. dated Sep. 25, 2012.
European Search Report from European Patent Application No. 12171403.4-2203/2515339, dated Nov. 12, 2012.
European Search Report from European Patent Application No. 12171401.8-2203/2515338, dated Nov. 13, 2012.
Examination Report for European Patent Application No. 05756258.9 dated Dec. 11, 2012.
Decision of Rejection from Japanese Patent Application No. 2008-500703, dated Nov. 20, 2012.
Decision of Rejection from Japanese Patent Application No. 2307-513155, dated Nov. 13, 2012.
Office Action from Taiwanese Patent Application No. 094111532, dated Nov. 23, 2012.
Office Action and Search Report from Taiwanese Patent Application No. 093127333. dated Jul. 5, 2012.
Office Action and Search Report from Taiwanese Patent Application No. 095103561, dated Jul. 24, 2012.
First Office Action from Chinese Patent Appl. No. 2011102654868, dated Jun. 19, 2013.
Notice of Reasons for Rejection from Japanese Patent Appl. No. 2007-513132, dated Jun. 25, 2013.
Interrogation from Japanese Patent Appl. No. 2007-513155, dated Jun. 25, 2013.
Office Action from Japanese Patent Appl. No. 2008-500703, dated Jun. 25, 2013.
A.J. Bergsma. "A Comprehensive Design Method for Dual Gate MOSFET Mixers", Ottawa Carleton Institute for Electrical Engineering. Dept. of Electronics, Carleton University, Ottawa, Canada. May 1995. © 1998 AJ Bergsma.
Vetury, et al., "Performance and RF Reliability of GaN—ON—SiC HEMTs Using Dual-Gate Architectures", Air Force Research Laboratory, Jul. 2006, Air Force Contract No. FA8650-05-C-5411, Wright-Patterson Air Force Base, OH 45433-7750.
Pretrial Examination Communication from Examiner from Japanese Patent Appl. No. 2008-500703, Appeal No. 2013-05298, dated Jun. 3, 2013.
Notice of Reasons for Rejection for Japanese Patent Appl. No. 2007-513167, dated Jan. 9, 2013.
Office Action from U.S. Appl. No. 12/497,468, dated Mar. 12, 2013.
Response to Office Action U.S. Appl. No. 12/497,468, dated Nov. 20, 2012.
Office Action from U.S. Appl. No. 12/497,468, dated Nov. 20, 2012.
Office Action from U.S. Appl. No. 13/245,579, dated Jan. 31, 2013.
Office Action from U.S. Appl. No. 13/072,449, dated Dec. 13, 2012.
Response to Office Action U.S. Appl. No. 13/072,449, filed Feb. 13, 2013.
Decision of Rejection from Japanese Patent appl. No. 2017-513167, dated Jul. 4, 2013.
Office Action from Taiwanese Patent Appl. No. 095103561, dated Jun. 27, 2013.
Office Action from Taiwanese Patent Appl. No. 101131917, dated Jul. 26, 2013.
Examination Report from European Patent Appl. No. 06 718 166.9, dated Aug. 13, 2013.
Office Action from U.S. Appl. No. 11/078,265, dated Aug. 15, 2013.
Office Action from U.S. Appl. No. 13/355,766, dated Aug. 9, 2013.
Office Action from U.S. Appl. No. 13/245,579, dated Oct. 25, 2013.
Examination Report from Canadian Patent Appl. No. 2,564,955, dated Dec. 6, 2012.
Examination Report from Canadian Patent Appl. No. 2,566,756, dated Nov. 7, 2013.
European Search Report from European Patent Appl. No. 12180744.0-1552, dated Dec. 12, 2013.
Notice of Reasons for Rejection from Japanese Patent Appl. No. 2008-500703, dated Nov. 12, 2013.
Reason for Rejection from Japanese Patent Appl. No. 2012-157890, dated Dec. 24, 2013.
European Search Report from European Patent Appl. No. EP 2 538 446 A3. Published Jan. 15, 2014.
Reasons for Rejection from Japanese Patent Appl. No. 2012-107672, dated Dec. 24, 2013.
Reasons for Rejection from Japanese Patent Appl. No. 2012-117726, dated Dec. 24, 2013.
Appeal Decision from Japanese Patent Appl. No. 2007-513155, dated Mar. 11, 2014.
Office Action from U.S. Appl. No. 13/355,766, dated Mar. 5, 2014.
Office Action from U.S. Appl. No. 13/245,579, dated Mar. 13, 2014.
Notice of Reasons for Rejection from Japanese Patent Appl. No. 2007-513167, dated Feb. 4, 2014.
Second Office Action from Chinese Patent Appl. No. 201110265486.8. dated Mar. 13, 2014.
Decision from Taiwanese Patent Appl. No. 095103561 dated Mar. 31, 2014.
Office Action from U.S. Appl. No. 11/078,265, dated Apr. 28, 2014.
Office Action from Japanese Patent Appl. No. 2013-050780, dated Jul. 1, 2014.
Third Office Action from Chinese Patent Appl. No. 200580014868. 6, dated Jul. 2, 2014.
International Search Report and Written Opinion from Appl. No. PCT/US2014/041171, dated Sep. 22, 2014.
Office Action from U.S. Appl. No. 13/355,766, dated Jul. 30, 2014.
Further Examination on European Patent Appl. No. 04 768 624.9, dated Aug. 5, 2014.
International Search Report and Written Opinion from PCT/US2014/037728, dated Aug. 18, 2014.
Decision of Patent Grant and Allowed Claims from Japanese Patent Appl. No. 2007-513167, dated Aug. 5, 2014.
Third Office Action from Chinese Appl. No. 201110265486.8, dated Sep. 17, 2014.
Communication from European Appl. No. 07 018 026.0-1552, dated Oct. 14, 2014.
Decision of Rejection from Japanese Appl. No. 2012-157890, dated Oct. 21, 2014.
Office Action from Taiwanese Patent Appl. No. 101124701, dated Oct. 14, 2014.

(56) References Cited

OTHER PUBLICATIONS

Office Action from Japanese Patent Appl. No. 2012-107672, dated Nov. 11, 2014.
Office Action from Japanese Patent Appl. No. 2013-050780, dated Dec. 9, 2014.
J. Li. et al., "High Breakdown Voltage GaN HFET with Field Plate", Electronic Letters, Feb. 1, 2001: vol. 37, No. 3.
Office Action from Taiwanese Patent Appl. No. 101137523, dated Dec. 31, 2014.
Examiner Report from Canadian Patent Appl. No. 2,566,361, dated Feb. 4, 2015.
Decision of Rejection from Japanese Patent Application No. 2012-117726, dated Jan. 27, 2015.
Zhang, et al., "High Breakdown GaN HEMT with Overlapping Gate Structure", IEEE Electron Device Letters, vol. 21, No. 9, Sep. 2000.
Office Action from U.S. Appl. No. 13/913,490, dated Dec. 16, 2014.
Office Action from U.S. Appl. No. 11/078,265, dated Dec. 29, 2014.
Office Action from U.S. Appl. No. 13/929,487, dated Dec. 29, 2014.
Office Action from U.S. Appl. No. 14/025,478, dated Jan. 21, 2015.
Office Action from U.S. Appl. No. 13/355,766, dated Feb. 13, 2015.
Office Action and Search Report from Taiwanese Appl. No. 102102725, dated Dec. 8, 2014.
R. Vetury, et al., "Performance and RF Reliability of GaN-on-SiC HEMT's using Dual-Gate Architectures", RF Micro Devices, Charlotte, NC, 28269, pp. 714-717, IEEE Jun. 1, 2006©.
Office Action from Taiwanese Patent Appl. No. 102102725, dated May 18, 2015.
Decision to Grant from European Patent Appl. No. 07018026.0, dated Aug. 6, 2015.
Office Action from U.S. Appl. No. 13/929,487, dated Jun. 3, 2015.
Office Action from U.S. Appl. No. 13/355,766, dated Jun. 22, 2015.
Reasons for Rejection from Japanese Patent Appl. No. 2014-126655, dated May 26, 2015.
Office Action from Japanese Patent Appl. No. 2012-157890, dated Apr. 22, 2015.
Notice of Allowance from Japanese Patent Appl. No. 2013-050780, dated Apr. 28, 2015.
Office Action from Japanese Patent Appl. No. 2012-107672, dated Jun. 9, 2015.
Office Action from U.S. Appl. No. 11/078,265, dated Apr. 1, 2015.
Fourth Office Action from Chinese Patent Appl. No. 201110265486.8, dated Apr. 15, 2015.
Examination from Canadian Patent Appl. No. 2,564,955, dated Apr. 7, 2015.
Office Action from Taiwanese Patent Appl. No. 103120237, dated Sep. 15, 2015.
Saito, et al. "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP, vol. 43, No. 4B, Apr. 2004, pp. 2239-2242, XP001227744, ISSN: 0021-4922.
Saito, et al, "Theoretical Limit Estimation of Lateral Wide Band-gap Semiconductor Power-switching Device", Solid State Electronics, Elsevier Science Publishers, Barking, GP, vol. 48, No. 9, Apr. 23, 2004, pp. 1555-1562, XP004518805, ISSN: 0038-1101.
Notice of Allowance from Taiwanese Patent Appl. No. 101137523, dated Sep. 25, 2015.
Examination Report from European Patent Appl. No. 10 183 441.4, dated Jul. 29, 2015.
Decision of Patent Grant from Japanese Patent Appl. No. 2012-157890, dated Aug. 18, 2015.
Fifth Office Action from Chinese Patent Appl. No. 200580014868.6, dated Aug. 27, 2015.
Office Action from U.S. Appl. No. 14/025,478, dated Aug. 4, 2015.
Response to OA from U.S. Appl. No. 14/025,478, filed Sep. 22, 2015.
Office Action from Patent Application No. 11/078, dated Sep. 18, 2015.
Office Action from Japanese Patent Appl. No. 2014-126655, dated Jan. 26, 2016.
Examination from European Patent appl. No. 12 171 403.4-1552, dated Jan. 21, 2016.
Correction of deficiencies from European Patent Appl. No. 14734340.4, dated Jan. 27, 2016.
Correction of deficiencies from European Patent Appl. No. 14727697.6, dated Jan. 20, 2016.
Office Action from U.S. Appl. No. 13/913,490; Nov. 25, 2015.
Office Action from U.S. Appl. No. 14/025,478; Dec. 4, 2015.
Office Action from U.S. Appl. No. 11/078,265; Dec. 9, 2015.
Office Action from U.S. Appl. No. 13/929,487; Feb. 5, 2016.
Examination Report from Taiwanese Patent Appl. No. 103119694, dated Oct. 19, 2015.
Fifth Office Action and Search Report from Chinese Patent Appl. No. 201110265486.8, dated Dec. 3, 2015.
K. Asano, et al., "Novel High Power AlGaAs/GaAs HFET with a Field-Modulating Plate Operated at 35V Drain Voltage", ULSI Device Development Laboratories, NEC Corporation 9-1, Seiran 2-Chome, Otsu, Shiga 520-0833, Japan, 62-IEDM 98, pub. Date: Dec. 6, 1996.
Examination Report from European Patent Appl. No. 12 171 401.8, dated Nov. 5, 2015.
Office Action from U.S. Appl. No. 13/913,490; Dated May 26, 2016.
Office Action from U.S. Appl. No. 11/018,265; Dated Jun. 23, 2016.
Office Action from U.S. Appl. No. 14/025,478; Dated Jul. 5, 2016.
Foreign Office Action for Application No. 103120237; Dated Jun. 8, 2016.
Notice of Allowance for Japanese Application No. 2014-126655; Jul. 5, 2016.
Notice of Allowance for Indian Application No. 6483/DELNP/2006; Aug. 4, 2016.
Notice of Reasons for Rejection for Application No. 2015-145765; Dated Apr. 26, 2016.
Notice of Allowance for Application No. 2,566,361; Dated Mar. 15, 2016.
Notice of Allowance for Application No. 2,564,955; Dated Feb. 29, 2016.
First Office Action re related Chinese Application No. 200580015278.5, Dated: May 9, 2008.
Office Action for U.S. Appl. No. 10/958,945; Dated Sep. 23, 2016.
Foreign Office Action for Taiwan Application No. 103120237; Dated Oct. 20, 2016.
Notice of Allowance from Chinese Application No. 200580014868.6; Dated Jul. 27, 2016.
Office Action from Japanese Application No. 2012-107672; Dated Oct. 4, 2016.
Foreign Office Action for Japanese Application No. 2015-145765; Dated Nov. 18, 2016.
Office Action for U.S. Appl. No. 14/025,478; Dated Dec. 1, 2016.
Foreign Office Action for European Appl. No. 14734340.4; Dated Jan. 5, 2017.
Foreign Office Action for European Appl. No. 14733486.6; Dated Jan. 5, 2017.
Notice of Allowance from Taiwanese Patent Appl. No. 101124701, dated Mar. 2, 2015.
Fourth Office Action from Chinese Patent Appl. No. 200580014868.6 dated Feb. 15, 2015.
Notice of Allowance frirri Taiwanese Patent Appl. No. 095103561, dated Feb. 17, 2015.
Intention to Grant from European Patent Appl. No. 07018026.0-1552, dated Mar. 25, 2015.
Office Action from Taiwanese Patent Application No. 094114829, dated May 29, 2012.
Official Notice of Rejection mailed on Jun. 24, 2008, Japanese Patent Application No. 2006-526270 and comments.
Related Chinese Office Action, Application No. 200580014866.7, Dated: Dec. 5, 2008 (Received Dec. 5, 2008).
Related Chinese Office Action, Application No. 200580014868.6, Received Dec. 5, 2008.

(56) References Cited

OTHER PUBLICATIONS

"High Power Density and Low Distortion InGaP Channel FET's with Field-Modulating Plate", Wakejima, et al., IEICE Trans Electron, vol. E85-C, No. 12, Dec. 2002, pp. 2041-2045.
"Very high voltage AlGaN/GaN high electron mobility transistors using a field plate deposited on a stepped insulator", Karmalker, et al., Solid-State Electronics 45 (2001) pp. 1645-1652.
Extended European Search Report from Appl. No. 11183396-8-2203/2432021, dated: Feb. 22, 2012.
Extended European Search Report from Appl. No. 11183404.0-2203, dated: Feb. 28, 2012.
Examiner's Report from Canadian Appl. No. 2566361, Dated: Feb. 7, 2012.
Extended European Search Report from Application No. 11183655.7-2203, dated: Mar. 1, 2012.
Examiner's Report for Canadian Patent Application No. 2,566,756, dated Feb. 16, 2012.
Examiner's Report for Canadian Patent Application No. 2,564,955, dated Feb. 24, 2012.
Summary of "Notice of Reasons for Rejection", Japanese Patent Application No. 2008-500703, dated Jan. 10, 2012.
Summary of "Notice of Reasons for Rejection", Japanese Patent Application No. 2007-238147, dated Jan. 24, 2012.
Asano K et al; "Novel High Power AlGaAs/GaAs HFET With a Field-Modulating Plate Operated At 35 V Drain Voltage", Electron Devices Meeting, 1998. IDM '98 Technical Digest. International San Francisco, CA USA Dec. 6-9, 1998, Piscataway, NJ, USA IEEE US, Dec. 6, 1998, pp. 59-62 XP010321500.
Wakejima A et al, "High Power Density and Low Distortion Ingap Channel FETs With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.
Mok P K T et al, "A Novel High-Voltage High-Speed MESFET Using a Standard GaAs Digital IC Process" IEEE Transactions on Electron Devices, IEEE Inc. New York, US. vol. 41, No. 2, Feb. 1, 1994, pp. 246-250, XP000478051.
Karmalkar S. et al. "Very High Voltage AlGaN/GaN High Electron Mobility Transistors Using a Field Plate Deposited on a Stepped Insulator" Solid State Electronics, Elsevier Science Publishers, Barking, GB, vol. 45, No. 9, Sep. 2001, pp. 1645-1652, XP004317729.
Li J, et al "High Breakdown Voltage GaN HFET With Field Palte" Electronics Letters, IEE Stevenage, GB vol. 37, No. 3, Feb. 1, 2001, pp. 196-197, XP006016221.
Xing H. et al. "High Breakdown Voltage AlGaN—GaN HEMTs Achieved by Multiple Field Plates" IEEE Electron Device Letters, IEEE Inc. New York, US. vol. 25, No. 4, Apr. 2004, pp. 161-163, XP001190361.
Kahn M A et al. "AlGaN/GaN Metal-Oxide-Semiconductor Heterostructure Field-Effect Transistors on SiC Substrates", Applied Physics Letters, American Institute of Physics. New York, US, vol. 77, No. 9, Aug. 2000, p. 1339-1341 XP000951319 ISSN: 0003-6951.
Lu W et al. "P-Type SiGe Transistors With Low Gate Leakage Using SiN Gate Dielectric", IEEE Electron Device Letters, IEEE, Inc., New York, US, vol. 20, No. 10, Oct. 1999 (Oct. 1999), pp. 514-516, XP000890470, ISSN: 0741-3106.
Zhang N-Q et al., "High Breakdown GaN HEMT With Overlapping Gate Structure", IEEE Electron Device Letters, IEEE, Inc. New York, US, vol. 9, Sep. 2000 (Sep. 2000), pp. 373-375, XP000954354, ISSN: 0741-3106.
Tilak, V. et al., "Effect of Passivation on AlGaN/GaN HEMT Device Performance", 2000 IEEE International Symposium on Compound Semiconductors. Proceedings of the IEEE 27th International Symposium on Compound Semiconductors (Cat. No. 00[TH]8498), 2000 IEEE International Symposium on Compound Semiconductors Proceedings of TH, p. 357-363, XP002239700, 2000, Piscataway, NJ, USA, IEEE, USA ISBN: 0-7803-6258-6.
Saito et al. "High Breakdown Voltage AlGaN—GaN Power-HEMT Design and High Currently Density Switching Behavior" IEEE Transactions on Electron Devices, vol. 50, No. 12, Dec. 2003, pp. 2528-2531.
Heikman et al. "Growth of Fe Doped Semi-Insulating GaN by Metalorganic Chemical Vapor Deposition", Applied Physics Letters, vol. 81, No. 3, Jul. 2002, pp. 439-441.
Heikman, "Growth and Characteristics of Fe-Doped GaN" Journal of Crystal Growth 248 (2003) 513-517.
The Electrical Enginering Handbook, 2d Edition, Dorf. pp. 994, (1997) CRC Press.
IEEE Electron Device Leters, vol. 18, No. 10, (Oct. 1997), p. 492.
Wu et al. "High Al Content AlGaN/GaN HEMTs on SiC Substrates With Very High Performance", IEDM—1999 Digest pp. 925-927, Washington, D.C. Dec. 1999.
IEEE Transactions on Electron Devices, vol. 48, No. 3, Mar. 2001, p. 581-585.
Supplemental Examination in European Patent Application No. 05731252.2 dated May 11, 2011.
Office Action for Taiwan Patent Application No. 09312733 dated Apr. 29, 2011.
Office Action for Korean Patent Application No. 10-2006-7026090 mailed May 17, 2011.
Office Action for Taiwan Patent Application No. 094111532 issued Jul. 4, 2011.
Office Action for counterpart Korean Patent Application No. 10-2006-7026207 mailed Jul. 26, 2011.
Summary of Notice of Reasons for Rejection for Japanese Patent Application No. JP 2007-513132 mailed Sep. 13, 2011.
Summary of Notice of Reasons for Rejection for Japanese Patent Application No. JP 2007-513155 mailed Sep. 13, 2011.
Summary of Notice of Reasons for Rejection for counterpart Japanese Patent Application No. 2007-513167 dated Dec. 6, 2011.
Decision of Rejection for Japanese Patent Application No. JP 2006-526270 dated Dec. 13, 2011.
Office Action from U.S. Appl. No. 13/072,371, dated: Mar. 29, 2012.
Summary of Decision of Rejection for Japanese Application No. 2007-513132, dated Mar. 13, 2012.
Decision of Rejection from Taiwanese Application No. 094111532, dated Apr. 11, 2012.
European Examination Report Application No. 05731252.2-2203 Dated: Jul. 30, 2008.
First Office Action from China, Application No. 200480032782.1, Dated Jul. 18, 2008.
Second Office Action re related Chinese Application No. 200480032782.1 dated Dec. 4, 2009.
Examiner's First Report on Patent Application re counterpart Australian Application No. 2005246697 dated Mar. 19, 2010.
International Preliminary Examination Report re related PCT Application, PCT/US05/13725 mailed May 25, 2007.
The First Office Action From China Application No. 200580015278.5, Filed Mar. 24, 2005, Date May 9, 2008.
PCT International Preliminary Report for Group of Related Applications, Dated: Aug. 25, 2008.
Office Action from related family, U.S. Appl. No. 11/807,701, dated Aug. 22, 2008.
Office Action from related family, U.S. Appl. No. 10/958,970, dated Sep. 10, 2008.
Office Action from U.S. Appl. No. 10/786,755, dated Jun. 22, 2011.
Office Action from U.S. Appl. No. 11/807,701, dated May 18, 2010.
Office Action from U.S. Appl. No. 11/807,701, dated Jan. 26, 2010.
Office Action from U.S. Appl. No. 12/321,493, dated Aug. 18, 2010.
Office Action from U.S. Appl. No. 12/321,493, dated Jun. 23, 2011.
Office Action from U.S. Appl. No. 12/321,493, dated Jan. 26, 2011.
Office Action from U.S. Appl. No. 12/437,505, dated Jul. 21, 2010.
Office Action from U.S. Appl. No. 12/497,468, dated Aug. 18, 2011.
Office Action from U.S. Appl. No. 12/497,468, dated Mar. 7, 2011.
Office Action from U.S. Appl. No. 11/078,265, dated Jun. 15, 2011.
Office Action from U.S. Appl. No. 11/078,265, dated Jan. 20, 2010.
Office Action from U.S. Appl. No. 11/600,617, dated Dec. 22, 2009.
Office Action from U.S. Appl. No. 11/584,135, dated Jun. 15, 2011.
Office Action from U.S. Appl. No. 11/901,103, dated Feb. 11, 2011.

(56) References Cited

OTHER PUBLICATIONS

Office Action from U.S. Appl. No. 11/901,103, dated Jun. 8, 2010.
Office Action from U.S. Appl. No. 11/078,265, dated Oct. 25, 2011.
First official communication regarding the related European Application No. 07018026.0, dated Dec. 17, 2008.
Japanese Office Action for Application No. 2015-145765; dated Apr. 18, 2017.
Japanese Petition Decision Application No. 2015-018473; dated Mar. 14, 2017.
Office Action for Taiwan Application No. 105134046; dated Jun. 3, 2017.
Office Action for European Application No. 14727697.6; dated Jun. 17, 2017.

* cited by examiner

WIDE BANDGAP FIELD EFFECT TRANSISTORS WITH SOURCE CONNECTED FIELD PLATES

This application claims the benefit of provisional application Ser. No. 60/571,342 to Wu et al., which was filed on May 13, 2004.

BACKGROUND OF THE INVENTION

Field of the Invention

The present invention relates to transistors and particularly to field effect transistors utilizing field plates.

Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821].

Electron trapping and the resulting difference between DC and RF characteristics have been a limiting factor in the performance of these devices. Silicon nitride (SiN) passivation has been successfully employed to alleviate this trapping problem resulting in high performance devices with power densities over 10 W/mm at 10 Ghz. For example, U.S. Pat. No. 6,586,781 which is incorporated herein by reference in its entirety discloses methods and structures for reducing the trapping effect in GaN-based transistors. However, due to the high electric fields existing in these structures, charge trapping is still an issue.

Field plates (FP) have been used to enhance the performance of GaN-based HEMTs at microwave frequencies [See S Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. These approaches, however, have involved a field plate connected to the gate of the transistor with the field plate on top of the drain side of the channel. This can result in a significant field plate to drain capacitance and the field plate connected to the gate adds additional gate-to-drain capacitance ($C_{gd}$) to the device. This can not only reduce gain, but can also cause instability due to poorer input-output isolation.

SUMMARY OF THE INVENTION

The present invention provides improved field effect transistors having a field plate connected to the source electrode. One embodiment of a field effect transistor according to the present invention comprises a metal semiconductor field effect transistor (MESFET) having a buffer layer on a substrate and a channel layer on the buffer layer with the buffer layer sandwiched between the channel layer and substrate. A source electrode is included in electrical contact with said plurality of the channel layer, along with a drain electrode in electrical contact with said channel layer. A gate is included in electrical contact with the channel layer and between the source and drain electrodes. A spacer layer is over at least a portion of the channel layer between the gate and the drain electrode. A field plate is formed on the spacer layer and electrically isolated from the channel layer and gate, with the field plate electrically connected to the source electrode by at least one conductive path.

Another embodiment of a field effect transistor according to the present invention comprises a buffer layer and channel layer formed successively on a substrate. A source electrode, drain electrode, and gate are all formed in electrical contact with the channel layer, with the gate between the source and drain electrodes. A spacer layer is formed on at least a portion of a surface of the channel layer between the gate and drain electrode and a field plate is separately formed on the spacer layer isolated from the gate and channel layer. The spacer layer is electrically connected by at least one conductive path to the source electrode, wherein the field plate reduces the peak operating electric field in the transistor.

Still another embodiment of a transistor according to the present invention comprises a metal semiconductor field effect transistor (MESFET) having a buffer layer and channel layer formed successively on a substrate. Source electrode, drain electrode, and gate are all formed in electrical contact with the channel layer with the gate between the source and drain electrodes. A field plate extends a distance $L_f$ from the edge of the gate to the drain electrode with the field plate isolated from the gate and active layers. At least one conductive path electrically connects the field plate to the source electrode, with the at least one conductive path covering less than all of the topmost surface between the gate and source electrode.

Still another embodiment of a transistor according to the present invention comprises an active region having a channel, source electrode, drain electrode, gate all in electrical contact with the channel layer, with the gate between the source and drain electrodes on the active region. The embodiment further comprises a spacer layer over at least a portion of the active region between the gate and the drain electrode. The embodiment further comprises a field plate on the spacer layer isolated from the active region and gate, the field plate electrically connected to the source electrode by at least one conductive path and extending a distance $L_f$ as measured from the edge of the gate to the drain electrode.

These and other further features and advantages of the invention would be apparent to those skilled in the art from the following detailed description, taking together with the accompanying drawings, in which:

DETAILED DESCRIPTION OF THE INVENTION

Figure 1:
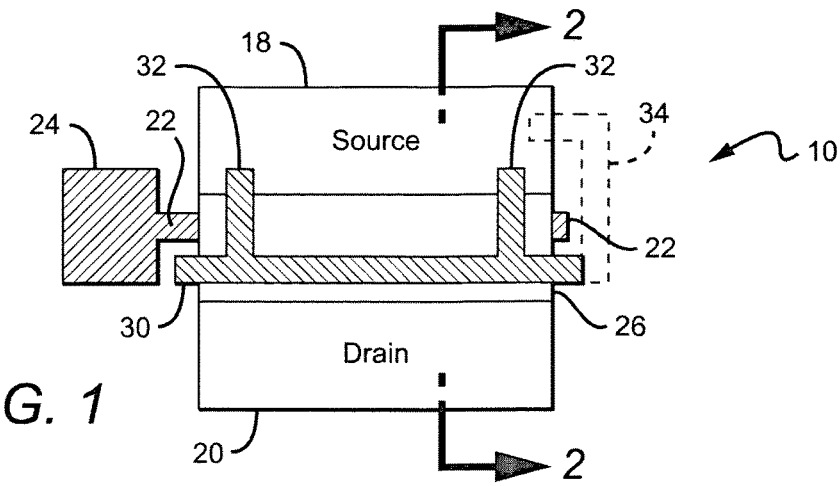
FIG. 1 is a plan view of one embodiment of a MESFET according to the present invention.

The field plate arrangements according to the present invention can be used with many different transistor structures. Wide bandgap transistor structures generally include an active region, with metal source and drain electrodes formed in electrical contact with the active region, and a gate electrode formed between the source and drain electrodes for modulating electric fields within the active region. A spacer layer is formed above the active region. The spacer layer can comprise a dielectric layer, or a combination of multiple dielectric layers. A conductive field plate is formed on the spacer layer and extends a distance $L_f$ from the edge of the gate electrode toward the drain electrode.

The field plate can be electrically connected to the source electrode. This field plate arrangement can reduce the peak electric field in the device, resulting in increased breakdown voltage and reduced trapping. The reduction of the electric field can also yield other benefits such as reduced leakage currents and enhanced reliability. By having the field plate electrically connected to the source electrode, the reduced gain and instability resulting from gate connected field plates is reduced. When arranged according to the present invention, the shielding effect of a source-connected field plate can reduce $C_{gd}$, which enhances input-output isolation.

One type of transistor that can utilize the field plate arrangement according to the present invention is a field effect transistor and particularly a metal semiconductor field effect transistor (MESFET), which typically includes a buffer layer and a channel layer on the buffer layer. A gate electrode is formed on the channel layer between source and drain electrodes.

According to the present invention, a spacer layer is formed on the channel layer covering at least a portion of the channel layer between the gate and drain electrode such that a field plate can be formed on the spacer layer in electric isolation from the channel layer. In other embodiments the spacer layer can also cover all or some of the gate such that the field plate can overlap the gate while remaining in electrical isolation from the gate and the channel layer. In a preferred embodiment the spacer layer covers the gate and the surface of the barrier layer between the gate and the source and drain electrodes. The spacer layer can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof, or epitaxial materials as further described below.

A conductive field plate is formed on the spacer layer and extends a distance $L_f$ as measured from the edge of the gate towards the drain electrode, with the field plate and gate electrode typically being formed during separate deposition steps. The field plate is electrically connected to the source electrode typically by conductive paths arranged in different ways.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Figure 2:
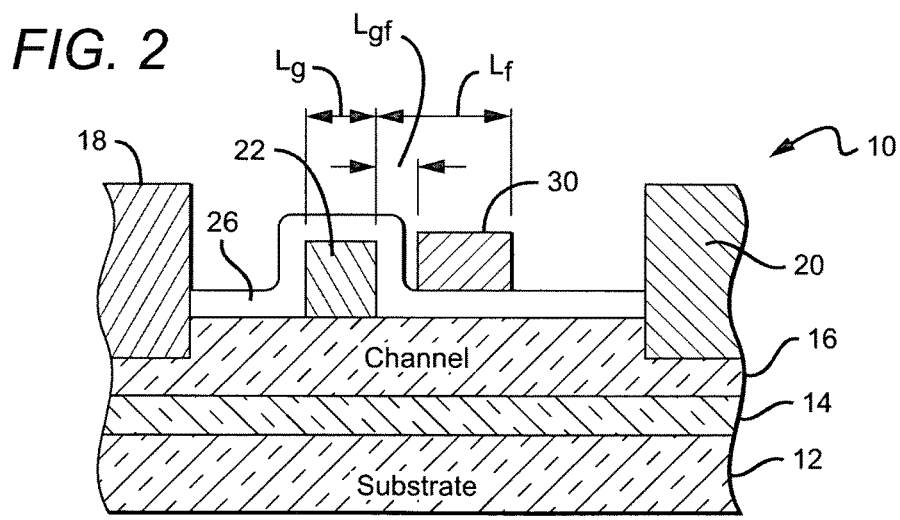
FIG. 2 is a sectional view of the MESFET in FIG. 1.

FIGS. 1 and 2 show one embodiment of a MESFET 10 according to the present invention that can be made from many different semiconductor material systems, with a preferred MESFET 10 being silicon carbide based. MESFET 10 comprises a substrate 12 that can be made of many different materials capable of supporting growth of a silicon carbide. The preferred substrate material is silicon carbide and in some embodiments, the substrate 12 can comprise semi-insulating 4H—SiC commercially available from Cree, Inc. of Durham, N.C.

The MESFET 10 further comprises a silicon carbide buffer layer 14 formed on the substrate 12 with a silicon carbide channel layer 16 formed on the buffer, with the buffer layer 14 sandwiched between the channel layer 16 and substrate 12. The buffer and channel layers 14, 16 can be formed on the substrate 12 using known semiconductor growth techniques such as Metal Oxide Chemical Vapor Deposition (MOCVD), Hydride Vapor Phase Epitaxy (HVPE) or Molecular Beam Epitaxy (MBE).

A nucleation layer (not shown) can be included between the substrate 12 and the buffer 14 to reduce any lattice mismatch between the two. The nucleation layer can comprise many different materials, can also be formed on the substrate 12 using MOCVD, HVPE or MBE. The formation of the nucleation layer can depend on the material used for the substrate 12. For example, methods of forming a nucleation layer on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

Metal source and drain electrodes 18, 20 are formed in contact with the channel layer 16 and a gate 22 is formed on the channel layer 16 between the source and drain electrodes 18, 20. Electric current can flow between the source and drain electrodes 18, 20 through the channel layer 16 when the gate 22 is biased at the appropriate level. The source and drain contacts 18, 20 can be made of different materials including but not limited to alloys of titanium, aluminum, gold, nickel, platinum, chromium, alloys of titanium and tungsten, or platinum silicide. The gate 22 can have many different lengths, with a preferred gate length ($L_g$) being approximately 0.5 microns. As best shown in FIG. 1, the gate 22 is connected to and contacted at a gate contact 24.

As best shown in FIG. 2, a first spacer layer 26 is formed over the gate 22 and the surface of the channel layer 16 between the gate 22 and the source and drain electrodes 18, 20. As mentioned above, however, the spacer layer 26 can cover less of the channel layer and the gate as long as enough of a spacer layer is provided to isolate the field plate from the gate and channel layer. The spacer layer 26 can comprise many of the different materials above, alone or in combination, but preferably comprises a layer of one of the dielectric materials listed above, or a number of different layers of dielectric materials. The spacer layer 26 can be many different thicknesses, with a suitable range of thicknesses be approximately 0.05 to 2 microns. Electric isolation between the devices is done with mesa etch or ion implementation outside the active area of the MESFET.

When the spacer layer 26 is formed before device metallization the spacer layer 26 can comprise an epitaxial material such a Group III nitride material having different Group III elements such as alloys of Al, Ga, or In, with a suitable spacer layer material being $Al_xGa_{1-x}N$ ($0 \le x \le 1$). After epitaxial growth of the channel layer 16, the spacer layer 26 can be grown using the same epitaxial growth method. The spacer layer 26 is then etched such that the gate 22, source electrode 18 and drain electrode 20 can be properly formed in contact with the channel layer 16 and the spacer layer 26. A field plate 30 can then be deposited on the spacer layer 26 between the gate 22 and drain electrode 20. In those embodiments where the field plate 30 overlaps the gate 22, an additional spacer layer 26 of dielectric material should be included at least partially over the gate 22 to isolate the gate 22 from the field plate 30.

A field plate 30 is formed on the spacer layer 26 between the gate 22 and the drain electrode 20, with the field plate 30 being in close proximity to the gate 22 but not overlapping it. A space between the gate 22 and field plate ($L_{gf}$) remains and should be wide enough to isolate from the field plate 30, while being small enough to maximize the field effect provided by the field plate 30. If $L_{gf}$ is too wide the field effect can be reduced. In one embodiment according to the present invention $L_{gf}$ can be approximately 0.4 microns or less, although larger and smaller spaces can also be used.

The field plate 30 can extend different distances $L_f$ from the edge of the gate 22, with a suitable range of distances being approximately 0.1 to 2 microns. The field plate 30 can comprise many different conductive materials with a suitable material being a metal, or combinations of metals, deposited using standard metallization methods. In some embodiments according to the present invention the field plate 30 comprises titanium/gold or nickel/gold.

The field plate 30 is electrically connected to the source contact 18 and FIG. 1 shows two connection structures that can be used according to the present invention, although it is understood that other connection structures can also be used. In those embodiments where the spacer layer covers the gate and the surface of the channel layer between the gate 22 and source electrode 18, conductive buses 32 can be formed on the spacer layer 26 to extend between the field plate 30 and the source electrode 18. Different numbers of buses 32 can be used although the greater the number of buses the greater the unwanted capacitance that can be introduced by the buses. The buses should have a sufficient number so that current effectively spreads between the source contact 18 and the field plate 30 while not covering too much of the MESFET's active region, with a suitable number of buses 32 being two. In one embodiment, the conductive paths do not cover all of the topmost layers between the gate and source electrode, which will preferable be the spacer layer 26.

Alternatively, the spacer layer 26 can cover only the surface of the channel layer in strips (not shown) between the gate and source electrode, with the strips having a width sufficient to support the conductive busses 32. The busses 32 would then extend from the field plate 30 over those spacer layer areas that cover the channel layer.

The field plate 30 can also be electrically connected to the source contact 20 through a conductive path 34 that runs outside of the active regions and spacer layer 26 of the MESFET 10 and is coupled to the source contact 20. This arrangement can be used in other embodiments but it is particularly adapted for use in embodiments where the spacer layer 26 does not cover the channel layer 16 between the gate 22 and the source 18. As shown in FIG. 1, the path 34 runs outside the active area of the MESFET at the side opposite the gate contact 24. In alternative embodiments according to the present invention, the conductive path could run outside the active area of the MESFET 10 on the side of the gate contact 24, or the MESFET 10 could include two or more conductive paths running out the same or different sides of the MESFET 10.

After deposition of the field plate 30 and its connection to the source electrode 18, the active structure can be covered by a dielectric passivation layer (not shown), such as silicon nitride. The passivation layer can be formed using known growth methods.

Figure 3:
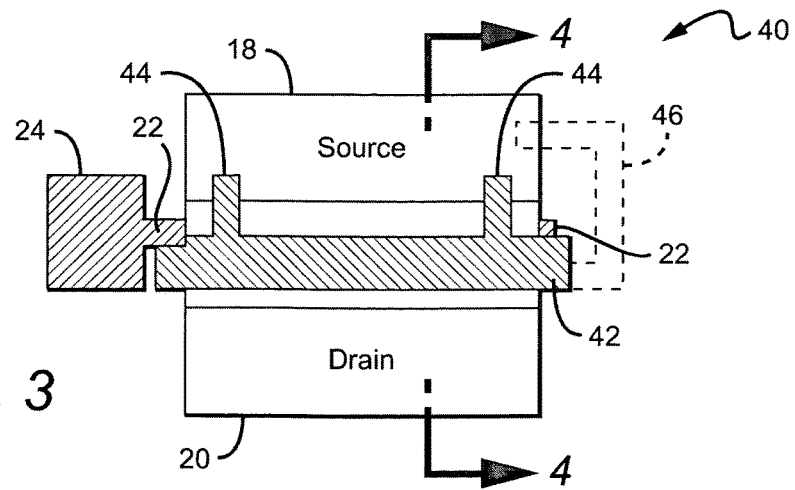
FIG. 3 is a plan view of another embodiment of a MESFET according to the present invention.
Figure 4:
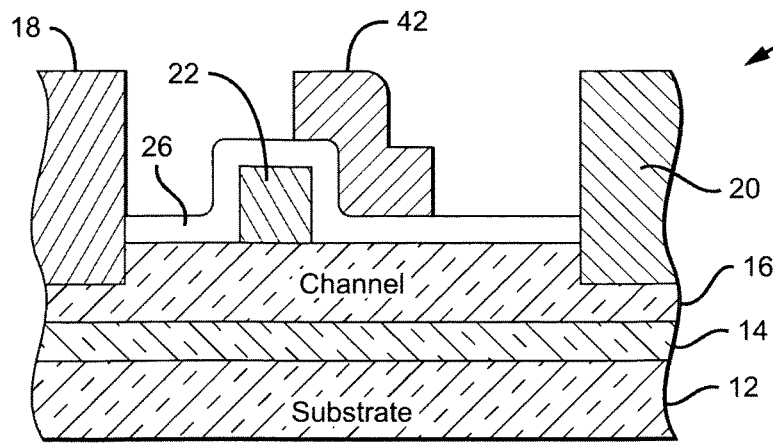
FIG. 4 is a sectional view of the MESFET in FIG. 3.

FIGS. 3 and 4 show another embodiment of a MESFET 40 according to the present invention having many features that are similar to those in MESFET 10. For the similar features the same reference numerals are used and the features are introduced without full description with the understanding that the description of the features above applies equally to the MESFET 40.

The MESFET 40 is preferably silicon carbide based and comprises a silicon carbide substrate 12, silicon carbide buffer layer 14, silicon carbide channel layer 16, source contact 18, drain contact 20, gate 22, gate contact 24 and spacer layer 26. The MESFET 40 also comprises a field plate 42 that is formed on the spacer layer 26 primarily between the gate 22 and the drain contact 20, but also overlapping a portion of the gate 22. For the MESFET 10 in FIGS. 1 and 2, $L_{gf}$ is small, which can present some difficulties during fabrication. By having the field plate 42 overlap the gate 22 the HEMT can be fabricated without having to meet the tolerances of $L_{gf}$. The overlapping section of the field plate 42, however, can introduce additional unwanted capacitance. In determining whether to use a field plate 30 or 42 the ease of manufacturing using field plate 42 must be balanced with the reduced capacitance provided by field plate 30 in FIGS. 1 and 2. The MESFET 40 also comprises either buses 44 or a conductive path 46 to electrically connect the field plate 42 to the source contact 18.

Figure 5:
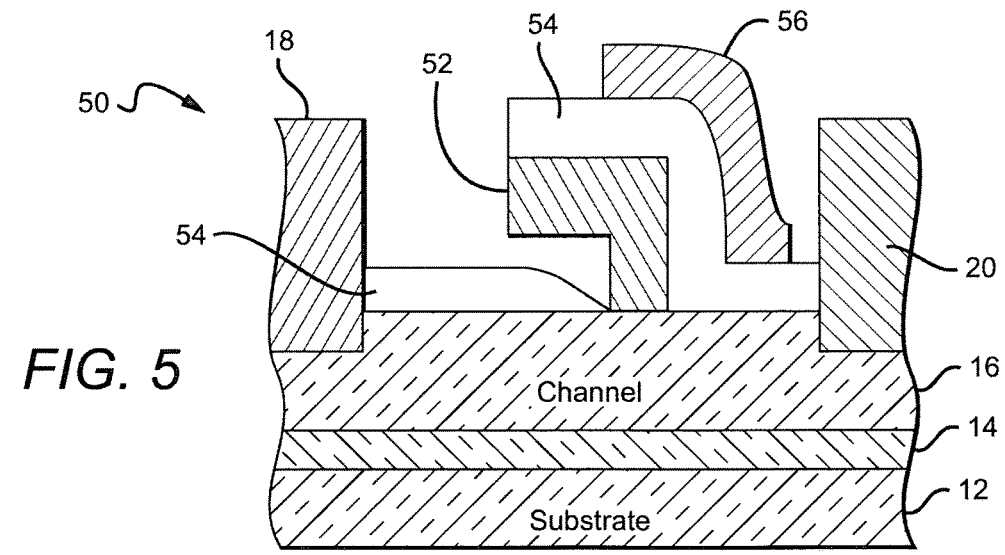
FIG. 5 is a sectional view of another embodiment of a MESFET according to the present invention having a gamma gate.

The source connected field plate arrangement according to the present invention can be used in many different MESFETs beyond those described above. For example, FIG. 5 shows another embodiment of a MESFET 50 according to the present invention that has many features similar to those in MESFETs 10 and 40, including a substrate 12, buffer layer 14, channel layer 16, source electrode 18, and drain electrode 20. MESFET 50, however, has a gamma (Γ) shaped gate 52 that is particularly adapted to high frequency operation. Gate length ($L_g$) is one of the important device dimensions in determining device speed, and with higher frequency devices the gate length is shorter. Shorter gate length can lead to high resistance that can negatively impact high frequency operation. T-gates are commonly used in high frequency operation, but it can be difficult to achieve a well-coupled placement of a field plate with a T-gate.

The gamma gate 52 provides for low gate resistance and allows for controlled definition of the gate footprint. A spacer layer 54 is included that covers the gamma gate 52 and the surface of barrier layer 16 between the gamma gate 52 and the source and drain electrodes 18, 20. A space can remain between the horizontal portion of the gamma gate 52 and the top of the spacer layer 54 between the gate 52 and the source electrode. The MESFET 50 also includes a field plate 56 on the spacer layer 54 that overlaps that gamma gate 52, with the field plate 56 preferably deposited on the side of the gamma gate 52 not having a horizontal overhanging section. This arrangement allows for tight placement and effective coupling between the field plate 56 and the active layers below it. In other gamma gate embodiments the field plate can be similarly arranged to field plate 56, but instead of overlapping the gate, there can be a space between the edge of the gate and the field plate similar to space $L_{gf}$ shown in FIG. 2.

The field plate 56 can be electrically connected to the source electrode 18 in many different ways. Because of the space between the lower surface of the horizontal section of the gate 52 and the spacer layer 54, it can be difficult to provide a conductive path directly between the field plate 56 and the source electrode 18. Instead, a conductive path can be included between the field plate 56 and the source electrode 18 that runs outside the active area of the MESFET 50. Alternatively, the gamma gate 52 can be completely covered by the spacer layer 54 with the space under the gate's horizontal section filled. Conductive paths can then run directly from the field plate 56 to the source electrode over the spacer layer 54. The active structure can then be covered by a dielectric passivation layer (not shown).

Figure 6:
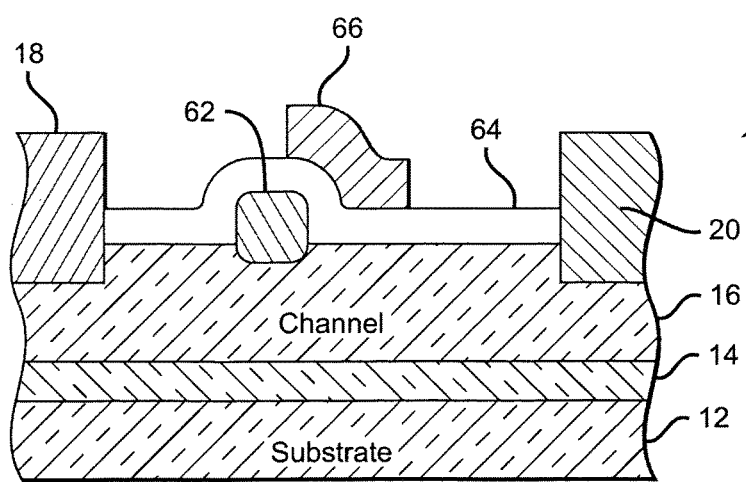
FIG. 6 is a sectional view of still another embodiment of a MESFET according to the present invention having a recessed gate.

FIG. 6 shows still another MESFET 60 according to the present invention that can also be arranged with a source connected field plate. MESFET 60 also has many features similar to those in MESFETs 10 and 40 in FIGS. 1-4, including a substrate 12, buffer layer 14, channel layer 16, source electrode 18, and drain electrode 20. The gate 62, however, is recessed in the channel layer 16, and is covered by a spacer layer 64. In other embodiments the bottom surface of the gate can be only partially recessed or different portions of the gate can be recessed to different depths in the channel layer 16. A field plate 66 is arranged on the spacer layer 64 and is electrically connected to the source electrode 18 and the active structure can be covered by a dielectric passivation layer (not shown). Like above of the MESFET 60, the field plate 66 can be arranged so that there is a space Lgf between the edge of the gate and the field plate.

The embodiments above provide wide bandgap transistors, particularly MESFETs, with improved power at microwave and millimeter wave frequencies. The MESFETs exhibit simultaneous high gain, high power, and more stable operation due to higher input-output isolation. The structure could be extended to larger dimensions for high voltage applications at lower frequencies.

Although the present invention has been described in considerable detail with reference to certain preferred configurations thereof, other versions are possible. The field plate arrangement can be used in many different devices. The field plates can also have many different shapes and can be connected to the source contact in many different ways. The spirit and scope of the invention should not be limited to the preferred versions of the invention described above.

We claim:

1. A metal semiconductor field effect transistor (MESFET), comprising:
    a buffer layer;
    a channel layer on said buffer layer;
    a source electrode in electrical contact with and on said channel layer;
    a drain electrode in electrical contact with and on said channel layer, wherein said source electrode and said drain electrode are at least partially recessed in said channel layer;
    a gate in electrical contact with and on said channel layer between said source electrode and said drain electrode, thereby creating a MESFET structure;
    a spacer layer over at least a portion of said channel layer between said gate and said drain electrode and between said gate and said source electrode; and
    a field plate on said spacer layer and separated from said channel layer and said gate by said spacer layer, said field plate being over only a portion of said gate, said field plate electrically connected to said source electrode by at least one conductive path, said at least one conductive path covering less than all of a topmost surface of said spacer layer between said gate and said source electrode, in which a first portion of the field plate extends beyond a vertical edge of the channel layer such that the at least one conductive path couples the first portion of the field plate to the source electrode and is not directly over an active region of the channel layer.

2. The MESFET of claim 1, wherein said at least one conductive path spreads current between said gate and said source electrode while minimizing unwanted capacitance.

3. The MESFET of claim 1, wherein said field plate extends on said spacer layer a distance $L_f$ from an edge of said gate toward said drain electrode.

4. The MESFET of claim 1, wherein said spacer layer at least partially covers said gate, and wherein said field plate at least partially overlaps said gate and extends on said spacer layer a distance $L_f$ from an edge of said gate toward said drain electrode.

5. The MESFET of claim 1, wherein said buffer layer and said channel layer are silicon carbide based.

6. The MESFET of claim 1, wherein said spacer layer comprises a dielectric material, or multiple layers of dielectric material.

7. The MESFET of claim 1, wherein said gate is gamma shaped.

8. The MESFET of claim 1, wherein said gate is at least partially recessed in said channel layer.

9. The MESFET of claim 1, wherein an edge of said gate and said field plate are separated by a space.

10. The MESFET of claim 1, wherein said at least one conductive path runs on a side of the MESFET.

11. A field effect transistor, comprising:
    a buffer layer;
    a channel layer;
    a source electrode, a drain electrode, and a gate each in electrical contact with and on said channel layer with said gate between said source electrode and said drain electrode, wherein said source electrode and said drain electrode are at least partially recessed in said channel layer, and wherein said gate comprises a portion that extends toward said source electrode on a first spacer layer;
    a second spacer layer on at least a portion of said channel layer between said gate and said drain electrode; and
    a field plate separated from said gate and said channel layer by said second spacer layer that isolates the field plate from the channel layer, said field plate over only a portion of said gate, said field plate being electrically connected by at least one conductive path to said source electrode, wherein said field plate reduces the peak operating electric field in said transistor, in which a first portion of the field plate extends beyond a vertical edge of the channel layer such that the at least one conductive path couples the first portion of the field plate to the source electrode and is not directly over an active region of the channel layer.

12. The field effect transistor of claim 11, wherein said reduction in peak operating electric field increases a breakdown voltage of said transistor.

13. The field effect transistor of claim 11, wherein said reduction in peak operating electric field reduces trapping in said transistor.

14. The field effect transistor of claim 11, wherein said reduction in peak operating electric field reduces leakage currents in said transistor.

15. The field effect transistor of claim 11, wherein said second spacer layer at least partially covers said gate and extends on at least part of the surface of said channel layer between said gate and said drain electrode, said field plate at least partially overlapping said gate and extending on said second spacer layer toward said drain electrode.

16. The field effect transistor of claim 11, wherein said first spacer layer is on a surface of said channel layer, between said gate and said source electrode.

17. The field effect transistor of claim 11, wherein said first and second spacer layers comprise a dielectric material, or multiple layers of dielectric material.

18. The transistor of claim 11, wherein the edge of said gate and said field plate are separated by a space.

19. The field effect transistor of claim 11, wherein said field plate is isolated from said gate and said channel layer by said second spacer layer.

20. The field effect transistor of claim 11, wherein said field plate is on said second spacer layer and separate from said source electrode.

21. The field effect transistor of claim 11, wherein said at least one conductive path runs on a side of the field effect transistor.

22. A metal semiconductor field effect transistor (MESFET), comprising:
    a buffer layer;
    a channel layer;
    a source electrode, a drain electrode, and a gate each in electrical contact with and on said channel layer, thereby creating a MESFET structure, wherein said source electrode and said drain electrode are at least partially recessed in said channel layer;
    a field plate overlapping only a portion of said gate and extending a distance $L_f$ from an edge of said gate horizontally toward said drain electrode to a field plate edge, said field plate edge being at least as close horizontally to said edge of said gate as to said drain electrode, said field plate isolated from said gate and said channel layer by a spacer layer formed at least partially over said gate; and
    at least one conductive path electrically connecting said field plate to said source electrode and covering less than all of said topmost surface of said MESFET between said gate and said source electrode, in which a first portion of the field plate extends beyond a vertical edge of the channel layer such that the at least one conductive path couples the first portion of the field plate to the source electrode and is not directly over an active region of the channel layer.

23. The MESFET of claim 22, further comprising a spacer layer between said field plate and said gate and channel layer to provide said field plate isolation.

24. The MESFET of claim 22, wherein said field plate reduces a peak operating electric field in said MESFET.

25. The MESFET of claim 24, wherein said reduction in peak operating electric field increases a breakdown voltage of said MESFET.

26. The MESFET of claim 24, wherein said reduction in peak operating electric field reduces trapping in said MESFET.

27. The MESFET of claim 24, wherein said reduction in peak operating electric field reduces leakage currents in said MESFET.

28. The MESFET of claim 22, wherein the edge of said gate and said field plate are separated by a space.

29. The MESFET of claim 22, wherein said field plate is on said spacer layer and separate from said source electrode.

30. The MESFET of claim 22, wherein said at least one conductive path runs on a side of the transistor.

31. A transistor, comprising:
    a channel layer comprising an active region;
    a source electrode, a drain electrode, and a gate each in electrical contact with and on said channel layer with said gate between said source electrode and said drain electrode, said source electrode and said drain electrode being at least partially recessed in said channel layer, and a portion of said gate extends toward said source electrode on a spacer layer;
    said spacer layer being over at least a portion of said active region between said gate and said drain electrode; and
    a field plate separate from said source electrode, said field plate on said spacer layer and separated from said active region and said gate by said spacer layer, said field plate over only a portion of said gate, said spacer layer at least partially over said gate, said field plate electrically connected to said source electrode by at least one conductive path, a first portion of said field plate extends beyond a vertical edge of said channel layer such that said at least one conductive path couples said first portion of said field plate to said source electrode and is not directly over an active region of said channel layer.

32. The transistor of claim 31, wherein said at least one conductive path electrically connecting said field plate to said source electrode covers less than all of a topmost surface of said spacer layer between said gate and said source electrode.

33. The transistor of claim 31, wherein said spacer layer between said field plate and said gate and active region provides a field plate isolation.

34. The transistor of claim 31, wherein the edge of said gate and said field plate are separated by a space.

35. The transistor of claim 31, wherein said at least one conductive path runs on a side of the transistor.

* * * * *